(12) United States Patent
Etori

(10) Patent No.: US 7,846,356 B2
(45) Date of Patent: Dec. 7, 2010

(54) METHOD FOR PRODUCING SURFACE CONVEXES AND CONCAVES

(75) Inventor: Hideki Etori, Saitama (JP)

(73) Assignee: Kimoto Co., Ltd., Tokyo (JP)

(*) Notice: Subject to any disclaimer, the term of this patent is extended or adjusted under 35 U.S.C. 154(b) by 250 days.

(21) Appl. No.: 11/992,054

(22) PCT Filed: Sep. 28, 2006

(86) PCT No.: PCT/JP2006/319301

§ 371 (c)(1),
(2), (4) Date: Mar. 14, 2008

(87) PCT Pub. No.: WO2007/040138

PCT Pub. Date: Apr. 12, 2007

(65) Prior Publication Data

US 2009/0261491 A1 Oct. 22, 2009

(30) Foreign Application Priority Data

Oct. 4, 2005 (JP) ............................. 2005-290737

(51) Int. Cl.
*B29D 11/00* (2006.01)
(52) U.S. Cl. ..................... 264/1.32; 264/1.36
(58) Field of Classification Search ............... 264/2.5, 264/1.32, 1.36
See application file for complete search history.

(56) References Cited

U.S. PATENT DOCUMENTS 5,298,366 A * 3/1994 Iwasaki et al. ............... 264/2.5

FOREIGN PATENT DOCUMENTS

| JP | 2004-046139 | 2/2004 |
|---|---|---|
| JP | 2004-280017 | 10/2004 |
| JP | 2004-294745 | 10/2004 |
| JP | 2004-310077 | 11/2004 |
| JP | 2006-003519 | 1/2006 |
| WO | WO/2004/021052 | 3/2004 |

OTHER PUBLICATIONS

Exposure Equipment of Ushio Inc., Optical Technology Information Magazine "Light edge" (with partial translation), No. 23, issued Nov. 2001, http//www.ushio.co.jp/documents/technology/lightedge 23/ushio le23-04.pdf.

* cited by examiner

*Primary Examiner*—Yogendra N Gupta
*Assistant Examiner*—Alison Hindenlang
(74) *Attorney, Agent, or Firm*—Bacon & Thomas, PLLC

(57) ABSTRACT

A method for producing surface convexes and concaves enabling easy and highly precise formation of desired convex and concave shapes using a photomask is provided.

A mask member having light transmitting sections and non-light transmitting sections is disposed over one side of a photosensitive film consisting of a photosensitive resin composition with an interval with respect to the photosensitive film, light is irradiated from a light source disposed on the side of the mask member to subject the photosensitive film to light exposure through the light transmitting sections of the mask member, and exposed portions or unexposed portions of the photosensitive film are removed by development to produce convexes and concaves on the photosensitive film in shapes determined by shapes of the exposed portions or unexposed portions. In the light exposure, light exposure conditions such as distance L between the light source and the mask member, size D of the light source and optical distance T between the mask member and the photosensitive film are controlled so as to control the shapes of the exposed portions or unexposed portions.

13 Claims, 15 Drawing Sheets

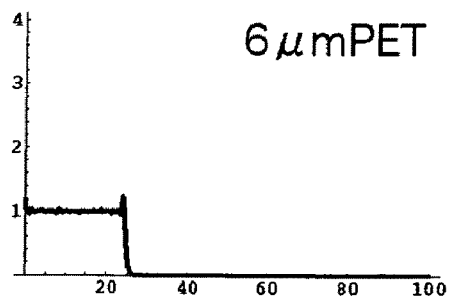
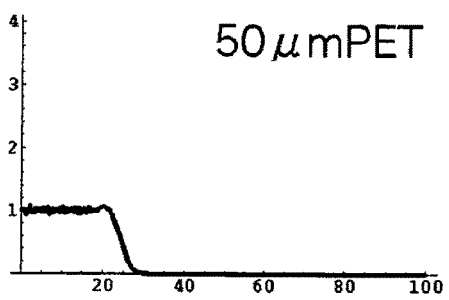
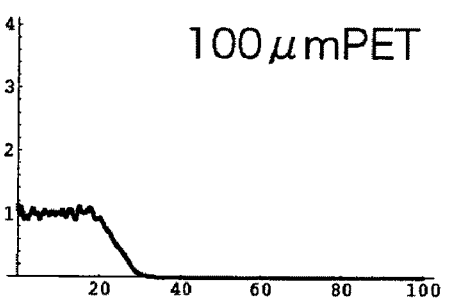
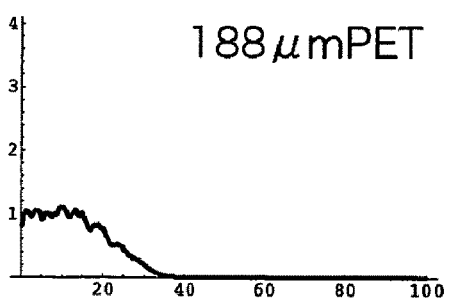
Fig. 4

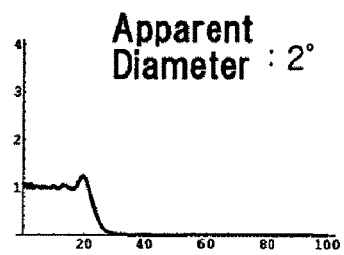
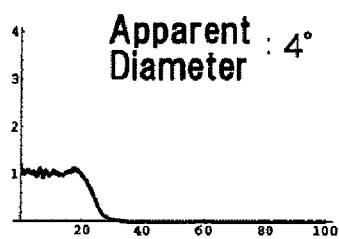
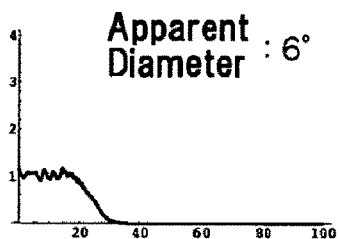
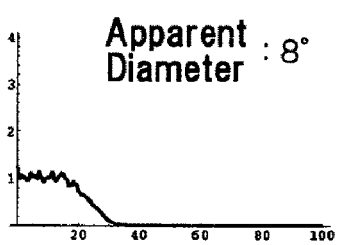
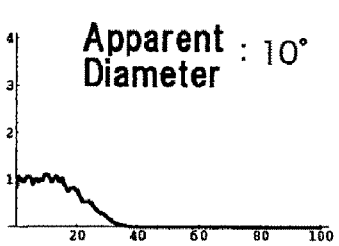
Fig. 5

(a) 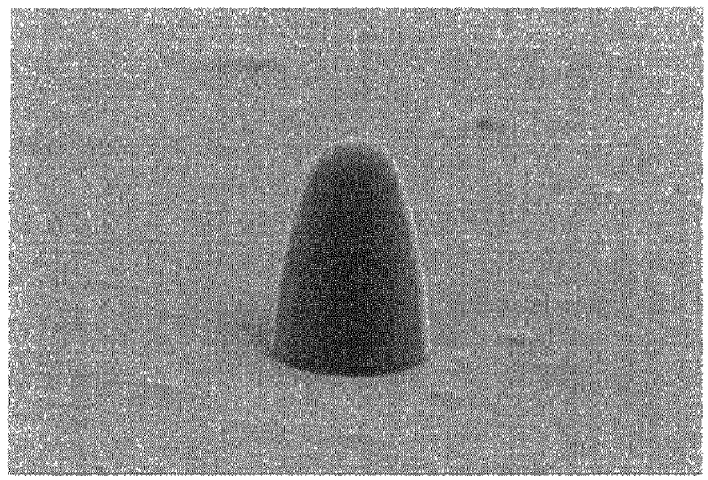
(b) 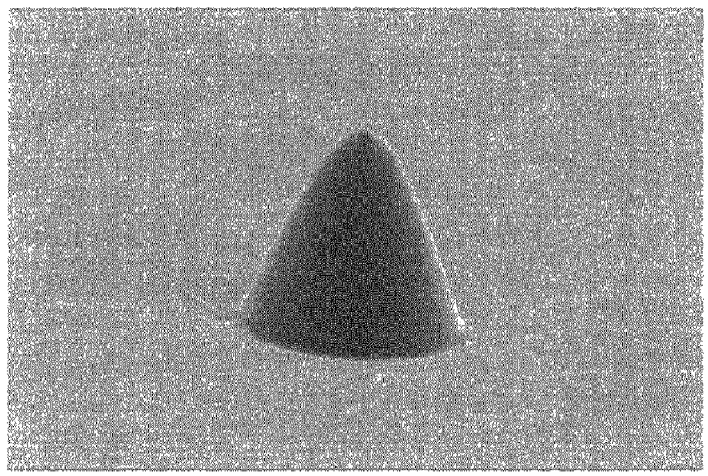
(c) 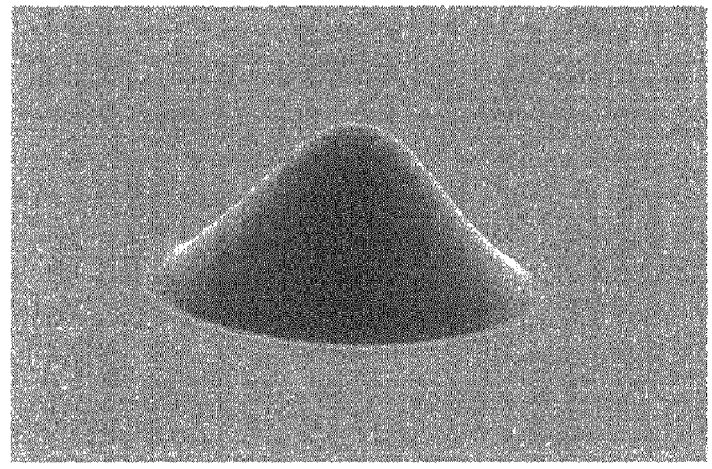
Fig. 6

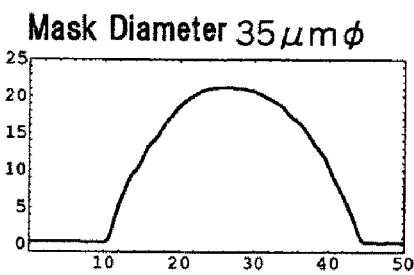
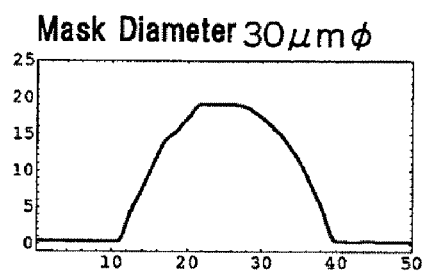
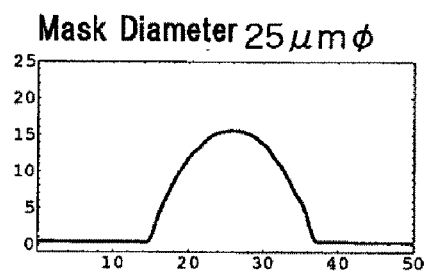
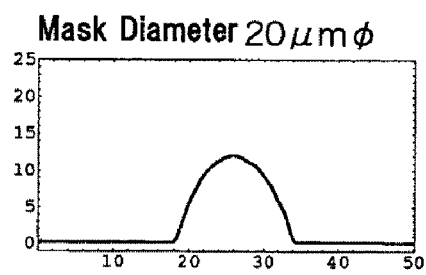
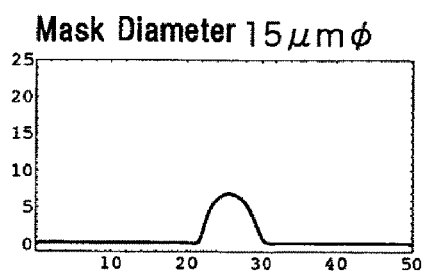
Fig. 7

METHOD FOR PRODUCING SURFACE CONVEXES AND CONCAVES

TECHNICAL FIELD

The present invention relates to a method for producing fine convexes and concaves on a surface of a material, in particular, a method for producing surface convexes and concaves suitable for the manufacture of optical materials having convexes and concaves on surfaces of transparent materials such as light diffusing plates, light control films and microlenses.

BACKGROUND ART

For various optical apparatuses, screens and displaying apparatuses such as liquid crystal displays, used are optical materials such as light control films and microlenses, in which fine convexes and concaves are provided on surfaces in order to control projection directions of transmitted light or reflected light. As such optical materials, not those simply having random convexes and concaves, but those having concaves and convexes of which shapes, intervals and so forth are highly precisely defined in order to control light paths have been proposed (for example, Patent document 1).

Generally employed as techniques for providing convexes and concaves on surfaces of materials are chemical matting in which a matting agent is mixed in a layer forming a surface, embossing, impressing and so forth. However, in the chemical matting, the matting agent itself has particle size distribution, and in addition, dispersion state thereof is not also completely uniform. Therefore, surface profiles having regularity or highly precisely defined surface profiles cannot be formed. Further, in the cases of embossing and impressing, although production of molds may be difficult depending on shapes of convexes and concaves, they have an advantage that if a mold is once produced, surface convexes and concaves can be easily formed thereafter. However, the same surface convexes and concaves cannot necessarily be formed even with the same mold depending on properties of materials, pressures at the time of pressing and so forth, and it is difficult to form convexes and concaves with good reproducibility on any materials.

In the manufacture of semiconductor devices and so forth, also proposed are methods of producing light diffusing plates or microlenses utilizing photolithography, which is a common technique (Patent documents 2 and 3). In the technique disclosed in Patent document 3, a gray scale mask pattern is used to control thickness of resist, which is solubilized by light exposure, and thereby produce microlenses having convexes of desired shapes. The gray scale mask is a mask in which light transmission distribution is formed by providing a pattern of tones, and a gray scale mask of which light transmission is controlled by changing size or numbers of apertures provided in the mask film is disclosed in Patent document 3.

Patent document 1: International Patent Publication

Patent document 2: Japanese Patent Unexamined Publication (KOKAI) No. 2004-294745

Patent document 3: Japanese Patent Unexamined Publication (KOKAI) No. 2004-310077

DISCLOSURE OF THE INVENTION

Object to be Achieved by the Invention

However, in a gray scale mask which controls light transmission by controlling size and number of apertures, many apertures of which pitches and sizes are controlled must be provided in a small region in order to form one convex or concave, and even when a reduction projection type light exposure apparatus is used, extremely precise processing is required for the mask. Moreover, in order to form convex and concave shapes as a continuous curved surface with no steps, it is necessary to perform multiplex light exposure using multiple kinds of masks, and thus the process of convex and concave formation becomes complicated.

SUMMARY OF THE INVENTION

Therefore, an object of the present invention is to provide a method enabling easy and highly precise formation of desired convex and concave shapes using a usual photomask without using a gray scale mask.

Means for Achieving the Object

The method for producing surface convexes and concaves of the present invention is a method for producing fine convexes and concaves on a surface of a material, which comprises the step of disposing a mask member having light transmitting sections and non-light transmitting sections over one side of a photosensitive film consisting of a photosensitive resin composition with an interval with respect to the photosensitive film, the step of exposing the photosensitive film to light from a light source disposed on the side of the mask member through the light transmitting sections of the mask member, and the step of removing exposed portions or unexposed portions of the photosensitive film by development to produce convexes and concaves on the photosensitive film in shapes determined by shapes of the exposed portions or unexposed portions, wherein, in the step of exposing the photosensitive film to light, light exposure conditions are controlled so as to control the shapes of the exposed portions or unexposed portions.

In the method for producing surface convexes and concaves of the present invention, the light exposure conditions include, for example, distance between the light source and a light shielding surface of the mask member and/or size of the light source. The light shielding surface of the mask member means a surface on which light-shielding patterns are formed.

Further, in the method for producing surface convexes and concaves of the present invention, the light exposure conditions are preferably controlled so that, when size of the light source is represented by D and distance between a point at which a normal of the light source passing the center of the light source (line passing the center and perpendicular to the mask member) crosses the light shielding surface of the mask member and the center of the light source is represented by L, the maximum of angle $\theta$ defined as $\theta = 2 \tan^{-1}(D/2L)$ should be larger than 0° and not larger than 30°. Here, $\theta$ is named an apparent diameter. The size of the light source D referred to here means size of light projecting surface seen from the light irradiated side (unit is length). When the light projecting surface has a circular shape as seen from the light irradiated side, the size D is the diameter of the circle, and when the light projecting surface has a shape other than circular shape, the size D is the maximum length of the shape.

In the method for producing surface convexes and concaves of the present invention, the light source may have, for example, a circular shape.

Further, in the method for producing surface convexes and concaves of the present invention, the step of disposing the mask member may include the step of controlling the interval between the mask member and the photosensitive film.

Further, in the method for producing surface convexes and concaves of the present invention, the photosensitive film may consist of a negative type photosensitive resin composition which is cured by light exposure.

Further, in the method for producing surface convexes and concaves of the present invention, the interval between the light shielding surface of the mask member and the photosensitive film is preferably controlled so that a value obtained by dividing the interval with refractive index of medium existing between them should be 2 mm or smaller.

Further, in the method for producing surface convexes and concaves of the present invention, the photosensitive film is preferably formed on or disposed in contact with a substantially transparent substrate, and the light exposure is preferably performed from the side of the substrate.

Further, in the method for producing surface convexes and concaves of the present invention, after the step of light exposure, the surface of the photosensitive film which has faced the mask member may be adhered to another substrate, and then development may be performed to produce a surface having convexes and concaves on the substrate.

The method for producing surface convexes and concaves of the present invention may be a method for producing a member having surface convexes and concaves by using a mold having fine surface convexes and concaves so that the member should have surface convexes and concaves in shapes complementary to shapes of the surface convexes and concaves of the mold, wherein the mold is a mold produced by the aforementioned method for producing surface convexes and concaves.

Further, the method for producing surface convexes and concaves of the present invention may be a method for producing a member having surface convexes and concaves by using a mold having fine surface convexes and concaves so that the member should have surface convexes and concaves in shapes complementary to shapes of the surface convexes and concaves of the mold, wherein the mold is a second mold produced by using a first mold produced by the aforementioned method for producing surface convexes and concaves, and surface convexes and concaves in the same shapes as those of the first mold are formed on the member.

Further, in the method for producing surface convexes and concaves of the present invention, the material on which surface convexes and concaves are formed is preferably an optical material such as light diffusing plate, light control film and microlens.

In the present invention, light includes not only visible lights but also ultraviolet rays and far ultraviolet rays.

Hereafter, the concept of the present invention will be explained.

In photolithography aiming at forming convexes and concaves in a certain film thickness such as photolithographic platemaking, in order to accurately reproduce a mask pattern, it is required that light used for light exposure should consist of parallel rays. Also in the conventional methods for producing surface convexes and concaves using a gray scale mask, distribution is imparted to light exposure of the exposed portions by controlling light transmittance of the mask on the assumption that the light consists of parallel rays.

Further, for formation of special convex and concave shapes in which height of the convex (film thickness) is high, a technique is also proposed in which resist is formed on a transparent substrate, and light exposure is performed from the substrate side (back side) in order to prevent underexposure and underdevelopment (Patent document 4). However, in order to prevent collapse of edge shapes of the exposed portions of the resist due to diffraction of light, the mask is generally placed in contact with the resist.

Patent document 4: Japanese Patent Unexamined Publication (KOKAI) No. 2000-103062

On the other hand, in the method for producing surface convexes and concaves of the present invention, a mask and a photosensitive film (resist) are not disposed in contact with each other, but the mask is disposed with an interval, and light is irradiated on a photosensitive film through the mask to utilize diffraction of light occurring according to the distance from the mask to the light entering surface of the resist and spread of light (collapse of parallelism) caused by the distance from the light source to the mask, and thereby impart distribution to the light exposure. That is, as shown in FIG. 1, when light is irradiated as parallel light to the photosensitive film through the mask, the light which passes through an aperture of the mask is diffracted and slightly spreads compared with the diameter of the aperture. When light is irradiated from the back side of the substrate applied with the photosensitive film, the spread of light is expanded by the diffraction of light according to the distance T between the mask and the photosensitive film, which corresponds to thickness of the substrate, and amount of light decreases in peripheral portions of the light flux.

Further, since the light source actually has a size, the spread of the light is not limited to the spread due to diffraction, but spread corresponding to the incidence angle of the incident light entering into the aperture of the mask is added, as shown in FIG. 2. The incidence angle of the incident light depends on the size D of the light source and the distance L between the light source and the light shielding surface of the mask. Thus, the light which enters into the photosensitive film becomes to have light exposure distribution by the spread of light. And this light exposure distribution depends on the distance T between the mask and the photosensitive film, the size D of the light source, and the distance L between the light source and the mask.

If angle θ defined as $\theta = 2 \tan^{-1}(D/2L)$ is used, wherein D represents the size of the light source 30, and L represents the distance between a point at which a normal of the light source passing the center of the light source crosses the light shielding surface of the mask member (in this specification, this angle is called apparent diameter of light source, unit is degree), two of the parameters, D and L, can be dealt as one parameter. Therefore, it can be regarded that the light exposure distribution depends on the distance T between the mask and the photosensitive film and the apparent diameter θ.

Light exposure required for photo-curing of a photo-curing resin (resist) is called critical light exposure Ec, and it is known that there is a relation represented by the following equation between curing depth Cd and critical light exposure Ec when the photo-curing resin is exposed to a predetermined light exposure E0.

[Equation 1]

$$Cd = Dp \times \ln\left(\frac{E0}{Ec}\right) \quad (1)$$

In the equation, Dp represents a depth at which intensity of ultraviolet ray irradiated on the resin surface becomes 1/e (it is called penetration depth), and Dp is a value characteristic to each resin.

Therefore, when light which produces light exposure distribution is irradiated, curing depth distribution is produced corresponding to the light exposure distribution, and as a result, it becomes possible to form convexes or concaves having a height or depth distribution. In the present invention, by controlling light exposure distribution using two of the parameters, the distance T between the mask and the resist and the apparent diameter θ of the light source, and the conditions of the light source (energy and shape of the light source), formation of desired surface convexes and concaves is enabled.

Effect of the Invention

According to the present invention, a desired convex and concave pattern can be produced with high precision by controlling the conditions of light exposure without using a gray scale mask or the like.

BRIEF DESCRIPTION OF THE DRAWINGS

FIG. 4 is a series of graphs showing effect of change of light exposure distribution depending on distance between mask and photosensitive film;

FIG. 5 is a series of graphs showing change of light exposure distribution depending on apparent diameter;

FIGS. 6a-6c show specific examples of convexes having different shapes and aspect ratios;

FIG. 7 is a series of graphs showing change in convex shape with change in mask aperture diameter;

DESCRIPTION OF PREFERRED EMBODIMENTS

Embodiments of the present invention will be explained hereafter.

Figure 3:
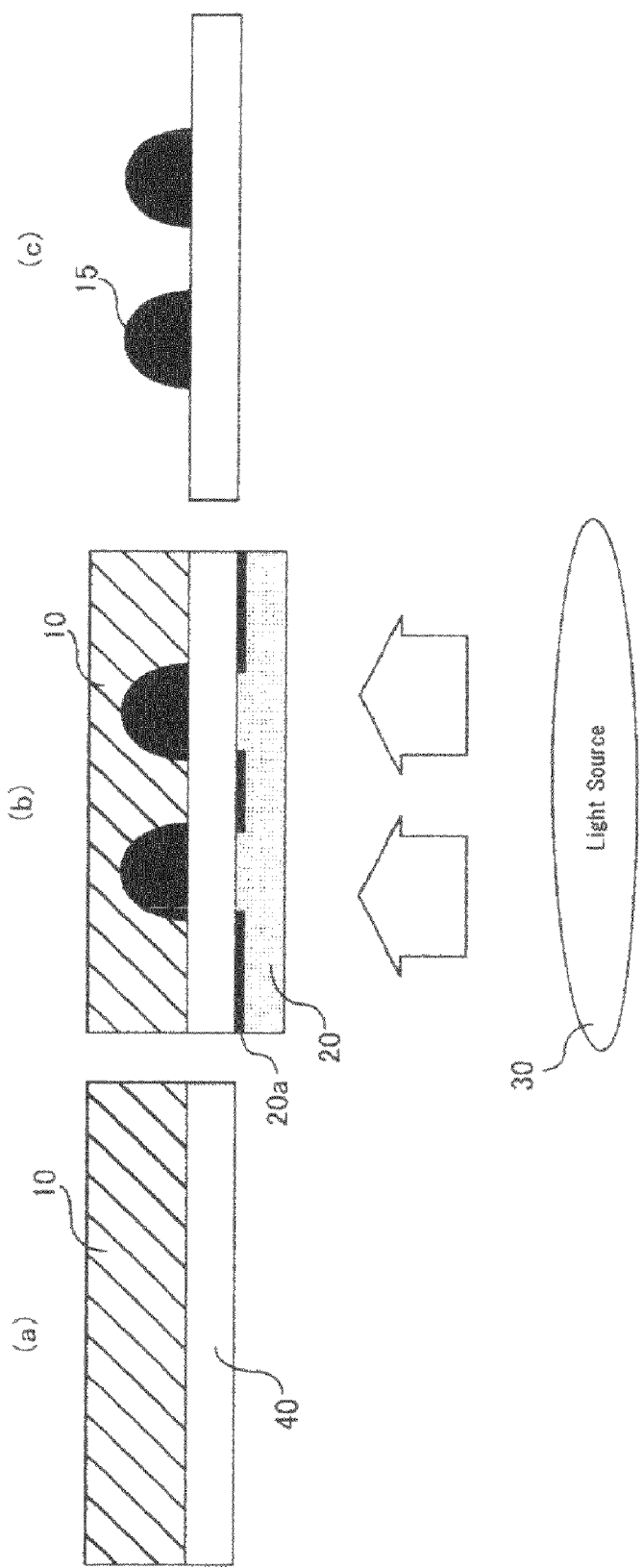
FIG. 3 is a schematic of the steps of the method of the present invention.

The outline of the method for producing surface convexes and concaves of the present invention is shown in FIG. 3. The method for producing surface convexes and concaves of the present invention mainly comprises the step of preparing a photosensitive film 10 consisting of a photosensitive resin composition which is cured or solubilized by light exposure (a), the light exposure step of exposing the photosensitive film 10 to light through a mask 20 (b), and the development step of developing the photosensitive film 10 to remove exposed portions or unexposed portions (c).

In the light exposure step, the mask 20 is disposed with a predetermined interval with respect to the photosensitive film 10, and light from a light source 30 is irradiated on the photosensitive film 10 through apertures of the mask 20, as shown in FIG. 3 (b). In the drawings, although the photosensitive film 10 is formed on a substrate 40, the substrate 40 is not indispensable. In the development step, the photosensitive film 10 is developed to remove exposed portions or unexposed portions and thereby form convexes and concaves 15, of which shapes are determined by the shapes of exposed portions or unexposed portions, on the photosensitive film. Then, portions of the photosensitive film not removed and remained are cured as required. In the method for producing surface convexes and concaves of the present invention, the shapes of the convexes and concaves are controlled by appropriately choosing the size D of the light source 30, the distance L between a point at which the normal of the light source 30 passing the center of the light source 30 crosses the light shielding surface of the mask 20 (surface 20a on which light shielding patterns are formed), and the interval T between the light shielding surface of the mask 20 and the photosensitive film 10.

Control of the convex and concave shapes in the light exposure step of the method for producing surface convexes and concaves of the present invention will be explained below.

Figure 1:
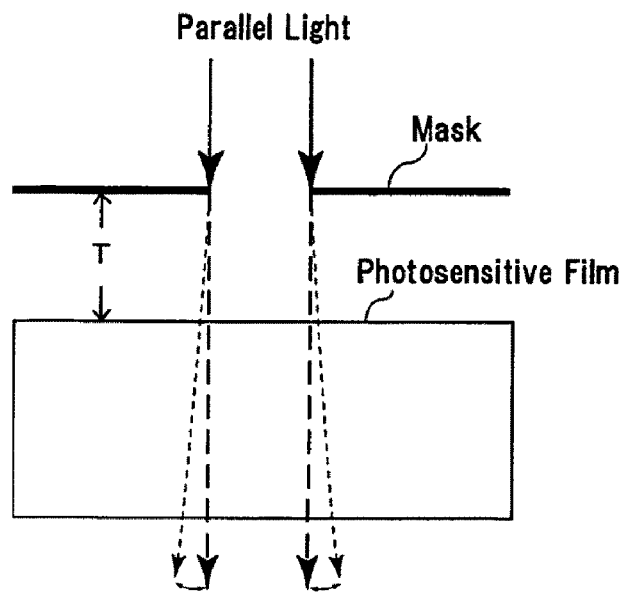
FIG. 1 is a schematic illustrating the principle of formation of convexes and concaves in the present invention.
Figure 2:
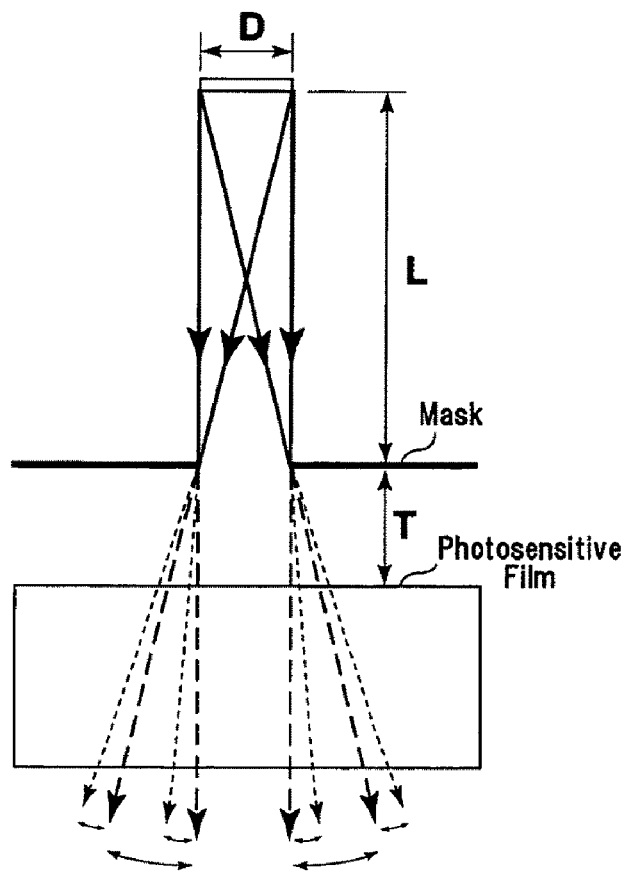
FIG. 2 is a schematic representation showing the variables L and D as controlled in the present invention.

When a photosensitive film is irradiated with light from a light source having a predetermined size through an aperture of a mask as shown in FIG. 2, spread of the diffracted light caused at the aperture of the mask can be defined on the basis of the Fresnel-Kirchhoff diffraction integral (following formula (2)), which represents diffraction of light from a point light source.

[Equation 2]

$$U(P) = -\frac{Ai}{2\lambda} \int\int \frac{e^{ik(r+s)}}{r+s}[\cos(n,r) - \cos(n,s)]dS \quad (2)$$

In the formula (2), U(P) represents amplitude of diffracted light at an arbitrary point P on the side opposite to the side of the light source, A represents amplitude of incident light, λ represents wavelength of diffracted light, r and s represent distance from the point light source to a specific point Q on the aperture of the mask and distance from the point Q to the point P, respectively, k ($=2\pi/\lambda$) is wave number, cos(n,r) is cosine of a vector connecting the point light source and the point Q and a normal of the light shielding surface of the mask, and cos(n,s) is cosine of a vector connecting the point P and the point Q and the normal of the light shielding surface of the mask.

Intensity of diffracted light emitted from the point light source at the arbitrary point P can be obtained as square of absolute value of U(P). In the case of a light source having a size, such a light source is regarded as a set of point light sources, and respective intensities of diffracted lights from point light sources are obtained according to the equation (2). Since these point light sources are not coherent, the sum of them serves as diffracted light intensity at the arbitrary point P.

Shown in FIG. 4 are the results of calculation of the diffracted light intensity at the photosensitive film with varying the distance T between the mask 20 and the photosensitive film 10 according to the aforementioned equation (2) assuming that the light source 30 has a circular shape. Further, the results of similar calculation with varying the apparent diameter θ of the light source 30 are shown in FIG. 5. In these calculations, it is assumed that the aperture of the mask is a circular aperture having a radius of 25 μm, and a medium having a refractive index of 1.64 exists between the mask 20 and the photosensitive film 10 (corresponding to the portion having a thickness of T). Further, in the calculation of which results are shown in FIG. 4, it is assumed that the light source has an apparent diameter of 10°, and in the calculation of which results are shown in FIG. 5, it is assumed that the distance T between the mask 20 and the photosensitive film 10 is 188 μm. In the graphs, the diffracted light intensities are represented with values normalized on the basis of the intensity of incident light taken as 1. In addition, FIGS. 4 and 5 each show the results for only a half portion from the center of the aperture of the mask.

As shown in FIG. 4, as the distance T between the mask 20 and the photosensitive film 10 becomes smaller, spread of diffracted light becomes smaller, and thus light exposure becomes more uniform, whereas as the distance T becomes larger, spread of diffracted light becomes lager, and amount of light gradually decreases at more peripheral parts of light flux. Further, as shown in FIG. 5, as the apparent diameter θ becomes smaller, spread of diffracted light becomes smaller, and thus light exposure becomes more uniform, whereas as the apparent diameter θ becomes lager, spread of diffracted light becomes larger, and thus amount of light gradually decreases at more peripheral parts of light flux.

Since such distribution of amount of light correlates with distribution of the depth (Cd) of the photosensitive film 10 insolubilized or solubilized by light exposure as shown by the aforementioned equation (1), by adjusting the distance T and/or the apparent diameter θ, it becomes possible to control the convex and concave shapes formed by the light exposure and subsequent development. Further, since the depth of light exposure depends on the light energy of light exposure, it becomes possible to control height of convex or depth of concave by adjusting light energy of the light source.

Shown in FIG. 6 are specific examples of convexes having different shapes and aspect ratios (ratio of height to width of bottom of convex) obtained with a mask having an aperture of a circular shape. Although only one convex is shown in each of the examples, many fine convexes can be formed by using a mask provided with many fine apertures (light transmitting sections).

In the method for producing convexes and concaves of the present invention, the apparent diameter θ is preferably controlled so that the maximum thereof should exceed 0° and should be not larger than 30°, more preferably not larger than 20°. Although convexes and concaves can be formed not based on the apparent diameter, convexes and concaves having a higher aspect ratio can be obtained with a smaller apparent diameter. Further, as for the distance T between mask 20 and the photosensitive film 10, although it depends on objective convex and concave shapes, when the convexes and concaves have sizes (height and width of bottom) of from submicron order to several hundreds of microns order, and the refractive index of the medium existing between the mask 20 and the photosensitive film 10 is represented by n, T/n is preferably 2 mm or smaller, more preferably 5 μm or larger and 1 mm or smaller. The distance T is divided with the refractive index n, because the wave number (k in the equation (2)) becomes larger as the refractive index becomes larger, and the wave number needs to be the same in order to obtain the same effect of the spread of light. In the design of the same convex and concave shapes, when a medium of a smaller refractive index exists, for example, the interval (thickness of the material) should be thinner compared with the case where a higher refractive index medium exists. Further, when two or more kinds of media exist, it is sufficient that t1/n1+t2/n2+ . . . should be within the aforementioned range, wherein t1, t2 . . . and n1, n2, . . . represents thicknesses and refractive indexes of the media, respectively. Further, the intervals do not need to be constant, and one-dimensional or two-dimensional gradient may be imparted to the intervals, or it is also possible to change the intervals themselves depending on positions thereof.

The shape of the aperture of the mask is not limited to a circular shape, and it may have an arbitrary shape. For example, when the aperture of the mask have a slit shape, the convex should have an elongated shape. Further, arrangement and pitches of the convexes and concaves are determined by arrangement and pitches of the apertures formed in the mask.

As described above, in the method for producing surface convexes and concaves of the present invention, by controlling the distance T between the mask 20 and the photosensitive film 10 and/or the apparent diameter θ as well as light energy (light exposure) of the light source in the light exposure step, the sectional shape of convex or concave and aspect ratio thereof (ratio of height to width of bottom of convex) can be controlled. Although specifically explained in the examples of this specification, if the diameter of the aperture of the mask is the same, the size of the bottom of convex or concave becomes larger as the apparent diameter θ becomes larger. If the light exposure and the distance T are the same, the aspect ratio becomes smaller as the apparent diameter θ becomes larger, and if the apparent diameter θ and the distance T are the same, the aspect ratio becomes smaller as the light exposure becomes smaller.

In the development step, a solvent which dissolves the photosensitive resin composition constituting the photosensitive film is used as a developing solution to remove portions of the photosensitive film other than those insolubilized by the light exposure (negative type). Alternatively, portions solubilized by the light exposure are removed (positive type). In both cases, the surface of the photosensitive film formed on the substrate (surface on the side opposite to the side of the substrate) can be developed to form fine convexes on the surface. Then, portions of the photosensitive film not removed and remained are further cured as required.

Hereafter, the materials used for carrying out the method for producing convexes and concaves of the present invention will be explained.

Although the photosensitive film 10 may be one produced as a solid film consisting only of a photosensitive resin composition, it is preferable to use one having a substrate 40 prepared by applying a photosensitive resin composition on the substrate 40 and drying it, or by disposing the photosensitive film in contact with the substrate 40, in order to maintain an interval between the photosensitive film 10 and the mask 20 in the light exposure step. When it is formed on the substrate 40, the photosensitive film 10 may be in a solid or liquid state. By providing the mask 20 in contact with a surface of the substrate 40 opposite to the surface on which the photosensitive film 10 is formed (henceforth referred to as back surface), the interval T determined by the thickness of the substrate 40 is formed between the photosensitive film 10 and the mask 20. Alternatively, by closely disposing the mask 20 on the back surface of the substrate 40 via a film or sheet consisting of a light transmitting material, the interval T determined by the total thickness of the thickness of the substrate 40 and the thickness of the film or sheet placed between the mask and the substrate is formed between the photosensitive film 10 and the mask 20.

As the photosensitive resin composition for forming the photosensitive film 10, resists and photo-curing resins generally used in the field of photolithography can be used. Examples of resins insolubilized or solubilized by light include photosensitive polymers obtained by introducing a photosensitive group such as cinnamate residue, chalcone residue, acrylate residue, diazonium salt residue, phenylazide residue, o-quinoneazide residue, coumarin residue, 2,5-dimethoxystilbene residue, stylylpyridine residue, α-phenylmaleimide, anthracene residue and pyrone residue into polyvinyl alcohols, novolac resins, acrylate type resins, epoxy type resins, and so forth.

Further, as the photo-curing resin, photopolymerizable prepolymers which are cured by crosslinking upon light irradiation can be used. Examples of the photopolymerizable prepolymers include resins having acrylate groups such as epoxy type acrylate, polyester type acrylate, polyurethane type acrylate and polyhydric alcohol type acrylate, polythiol-polyene resins, and so forth. Although the photopolymerizable prepolymers may be used alone, photopolymerizable monomers may be added in order to improve the crosslinking-curable property and strength of film cured by crosslinking. Used as the photopolymerizable monomers are one or two or more kinds of monofunctional acrylic monomers such as 2-ethylhexyl acrylate, 2-hydroxyethyl acrylate, 2-hydroxypropyl acrylate and butoxyethyl acrylate, bifunctional acrylic monomers such as 1,6-hexanediol acrylate, neopentylglycol diacrylate, diethylene glycol diacrylate, polyethylene glycol diacrylate, and hydroxypivalic acid ester neopentylglycol diacrylate, polyfunctional acrylic monomers such as dipentaerythritol hexaacrylate, trimethylpropane triacrylate and pentaerythritol triacrylate, and so forth.

The photosensitive resin composition may contain a photopolymerization initiator, ultraviolet sensitizing agent, or the like, as required, in addition to the photosensitive polymer or the photopolymerizable prepolymer and the photopolymerizable monomer mentioned above. Usable as the photopolymerization initiator are radical type photopolymerization initiators such as those of benzoin ether type, ketal type, acetophenone type and thioxanthone type, cation type photopolymerization initiators such as those of diazonium salts, diaryliodonium salts, triarylsulfonium salts, triarylbilirium salts, benzylpyridinium thiocyanate, dialkylphenacylsulfonium salts, dialkylhydroxyphenylsulfonium salts and dialkylhydroxyphenylphosphonium salt, complex type of these, and so forth.

When the material on which surface convexes and concaves are formed is used as it is as a light diffusing film, a light control film, or the like, it is preferable to use a highly light transmitting material for the photosensitive film. As such a material, acrylics type resins are especially preferred among the photosensitive resins mentioned above. When convexes and concaves formed on the photosensitive film are used as a mold, the photosensitive film may be colored depending on the use of the member on which surface convexes and concaves are formed.

Thickness of the photosensitive film 10 is not particularly limited, and it is sufficient that it should be thicker than the height of convex (depth of concave) to be formed.

The material of the substrate 40 is not particularly limited so long as a material showing transmissivity for light used for the light exposure is chosen, and a plate or film consisting of glass, plastics or the like can be used. Specifically, usable are plastic films or sheets of polyethylene terephthalate, polybutylene terephthalate, polyethylene naphthalate, polycarbonate, polypropylene, polyethylene, polyarylate, acrylic resin, acetyl cellulose, polyvinyl chloride, or the like. In view of dimensional stability, those subjected to stretching, in particular, biaxial stretching, are especially preferred.

Thickness of the substrate 40 is for giving a minimum interval between the photosensitive film 10 and the mask 20 (surface of the mask on which the light-shielding patterns are formed) at the time of the light exposure of the photosensitive film 10 as described above, and it is suitably selected depending on the convexes and concaves to be formed on the photosensitive film 10. For example, when the sizes of the convex and concave (height and width of bottom of convex or concave) are in a submicron order to order of several hundreds of microns, T/n, wherein n is the refractive index of the material constituting the substrate, is preferably 2 mm or less, more preferably 5 µm or more and 1 mm or less. In the design of the same convexes and concaves, when a material having a lower refractive index is used, for example, the thickness should be made thinner compared with the case where a material having a higher refractive index is used.

As the mask 20, photomasks generally used in the field of photolithography can be used. When the photosensitive film is that of negative type, a mask 20 in which many fine apertures (holes) corresponding to the objective shape are formed is used, and when the photosensitive film is that of positive type, a mask 20 on which light-shielding patterns corresponding to the objective shapes are formed is used. The aperture or light-shielding pattern may have, for example, a circular shape or an elliptical shape, but the shape is not limited to them. The aperture or light-shielding pattern may have a shape of elongated slit. The arrangement of the apertures or light-shielding patterns may different depending on the objective convexes and concaves, and it may be random or regular arrangement. When the light source has a circular shape, the shape of the bottom of convex becomes substantially the same as that of the shape of the aperture or light-shielding pattern of the mask 20. Even when the shape of the aperture of the mask is the same, the shape of the bottom of convex may differ depending on the shape of the light source. Specifically, when the shape of aperture or light-shielding pattern has a circular shape, an elliptic bottom of convex can be obtained by using a light source having an elliptic shape, although it may depend on the diameter of the circle or the value of T/n.

Figure 8:
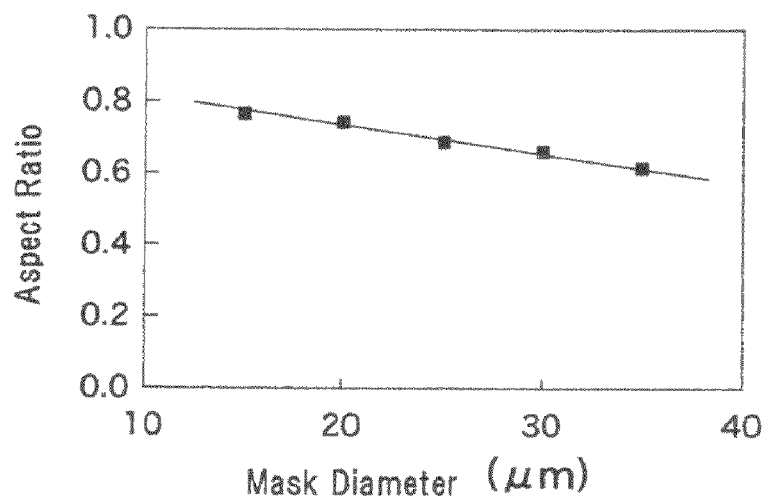
FIG. 8 is a graph of aspect ratio versus mask aperture diameter.

For the case of circular aperture of the mask, changes of sectional shape of convex and change of the ratio of height to width of the bottom of convex (aspect ratio) observed with change of the diameter of the aperture are shown in FIG. 7 and FIG. 8, respectively.

The light source 30 may be one emitting light of a wavelength at which the photosensitive resin composition mentioned above reacts. Specifically, when a photosensitive resin reacting to ultraviolet radiation is used, UV ramps such as high pressure mercury vapor lamp, metal halide lamp and xenon lamp can be used. Further, the light source is preferably provided with a light diffusing plate for making emitted light uniform.

As already described above, the size of the light source 30 means a size of light projecting surface seen from the light irradiated side in the present invention. However, when the light source has a light diffusing plate, it means a size of light projecting surface of the light diffusing plate seen from the light irradiated side.

Figure 9:
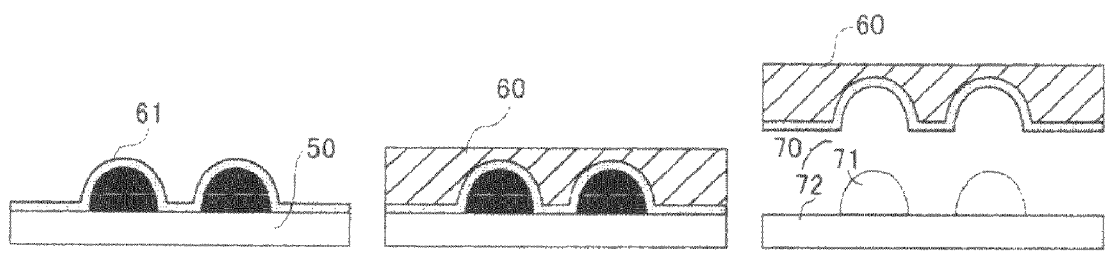
FIG. 9 is a schematic representation of the steps of another embodiment of the method of the present invention.

When the photosensitive film on which fine convexes and concaves are produced by the method for producing surface convexes and concaves of the present invention after curing (called member having surface convexes and concaves) is transparent, it can be used as it is as an optical member, or used in combination with another optical member. Alternatively, as shown in FIG. 9, it is also possible to further produce an electrocasting mold 60 by using a member having surface convexes and concaves 50 produced by the method for producing surface convexes and concaves of the present invention as a mold and produce a large number of members 70 having the same surface shape as that of the member having surface convexes and concaves by using the electrocasting mold 60. Specifically, a conductive film 61 is formed on the surface of the member having surface convexes and concaves 50 by sputtering or the like, then an electrocasting layer is formed on the surface of the conductive film by a usual electrocasting method, and the member having surface convexes and concaves 50 is removed to produce the electrocasting mold 60. This electrocasting mold 60 is filled with, for example, a photo-curing resin 71, then covered with a transparent film 72, and irradiated with light through the film 72 to cure the photo-curing resin 71 and thereby form a member 70 having the same convexes and concaves as those of the member having surface convexes and concaves 50 serving as an original.

Since the range of material selection is widened by using such an electrocasting mold 60, a material having superior characteristics required for a specific objective use (for example, optical member) can be chosen to easily produce a lot of the objective members on which convexes and concaves are highly precisely formed. For example, by using a transparent material as the photosensitive film, optical materials such as light diffusing plates, light control films and microlenses can be produced.

EXAMPLES

Hereafter, examples of the method for producing surface convexes and concaves of the present invention will be explained.

Example 1

On each of polyester films having a thickness of 50 urn or 100 μm (trade name: COSMOSHINE A4300, Toyobo, Co., Ltd., refractive index: 1.64), resist (EKIRESIN PER-800 RB-2203, Goo Chemical Co., Ltd.) was applied and dried to form a photosensitive film having a film thickness of 100 μm. On the surface of each polyester film opposite to the surface having the photosensitive film, a chromium mask (henceforth referred to as Cr mask) having multiple circular apertures having different diameters (diameter: 20 μm or 40 μm) was disposed so that the light-shielding surface should be in contact with the polyester film, and light exposure was performed from the Cr mask side under the following conditions.

1. Light Exposure Conditions

The light exposure was performed by using a light exposure apparatus using a high pressure mercury vapor lamp as a light source (Jet Light JL-2300, ORC Manufacturing Co., Ltd.).

The Cr mask was disposed at a position at a distance of 1 m from the center of the light source so that light should perpendicularly enter into the mask surface. Further, a flat light-shielding screen having one circular aperture was placed so that it should be perpendicular to the line connecting the center of the light source and the mask, and the aforementioned line should pass approximately the center of the circular aperture. Furthermore, a light diffusing film is placed on the part for the circular aperture of the light-shielding screen, so that the aperture of the light-shielding screen should serve as a surface light source.

The distance L from the surface of the Cr mask to the light-shielding screen was set to be 450 mm, and the diameter of the circular aperture (opening diameter) D of the light-shielding screen was changed to change the apparent diameter. The relation between the apparent diameter and the opening diameter D is shown in Table 1.

Light exposure was measured for light mainly of 365 nm with an integrating actinometer (UIT-102 (light receiving part: UVD-365PD), USHIO, INC.), and changed to be 8 mJ/cm$^2$, 15 mJ/cm$^2$ and 30 mJ/cm$^2$.

TABLE 1

| Apparent diameter θ (degree) | D (mm) |
| --- | --- |
| 5 | 38.5 |
| 10 | 78.4 |
| 20 | 159.0 |
| 30 | 242.0 |

2. Distance Between Mask and Resist (T)

The light exposure was performed under three kinds of conditions, T=50 μm (Cr mask was placed in contact with polyester film having a thickness of 50 μm), T=100 μm (Cr mask was placed in contact with polyester film having a thickness of 100 μm), and T=200 μm (between the Cr mask and the polyester film having a thickness of 100 μm, the same polyester film as the substrate was inserted). Since the refractive index of the polyester films was 1.64, the values obtained by dividing T with the refractive index were 30.5 μm, 70.0 μm and 122.0 μm, respectively.

After the light exposure, the resist was developed with a developer (1% aqueous solution of sodium carbonate), then washed with running water, and dried to obtain samples on which convexes and concaves were formed on the substrate surfaces.

The surface profile of the sample obtained under each light exposure condition was measured with a laser microscope (VK-9500, KEYENCE CORP.). Sectional shapes of the measured surface profiles along a line passing the center of each convex are shown in FIGS. 10 to 17.

Figure 10:
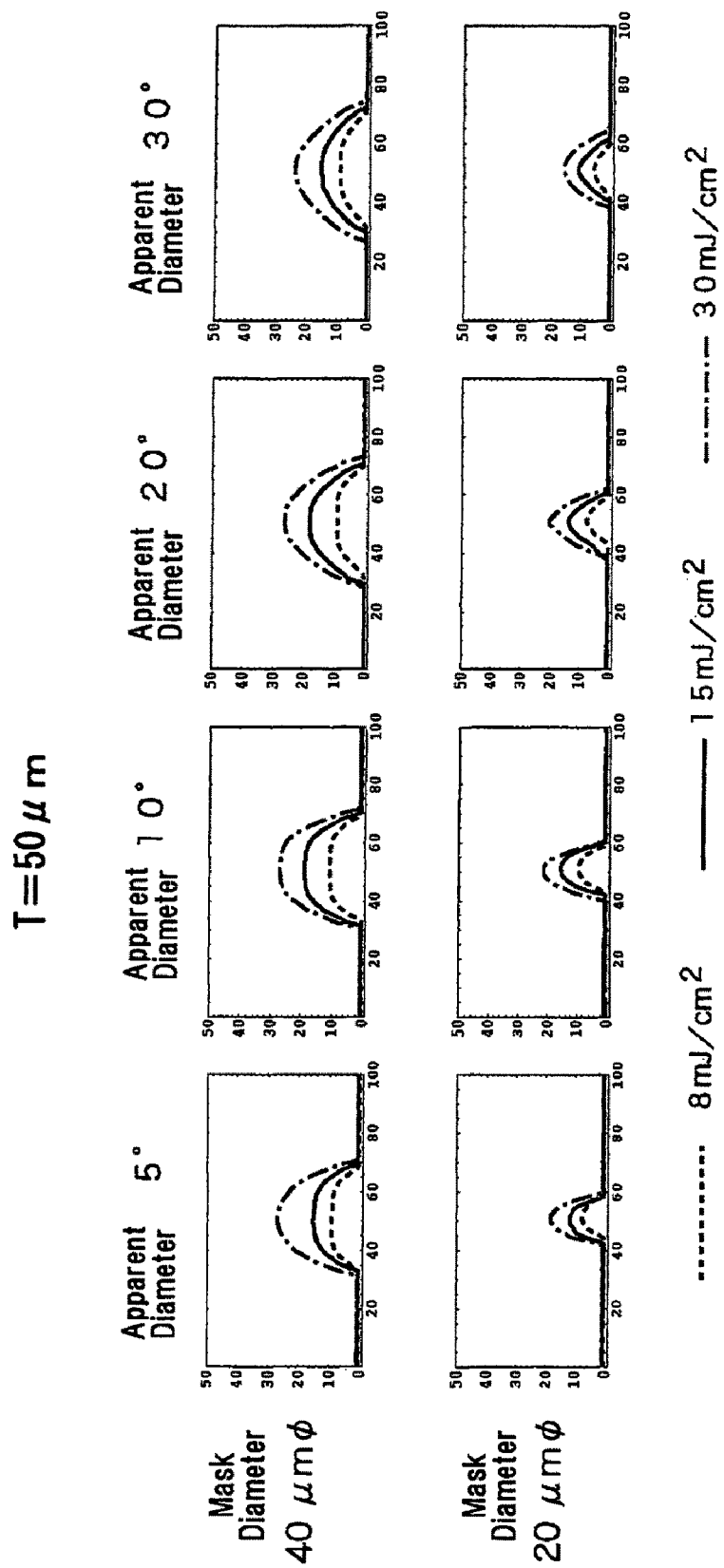
FIG. 10 is a series of graphs showing change of convex shape depending on light exposure with fixed mask aperture diameter and different apparent diameters.
Figure 11:
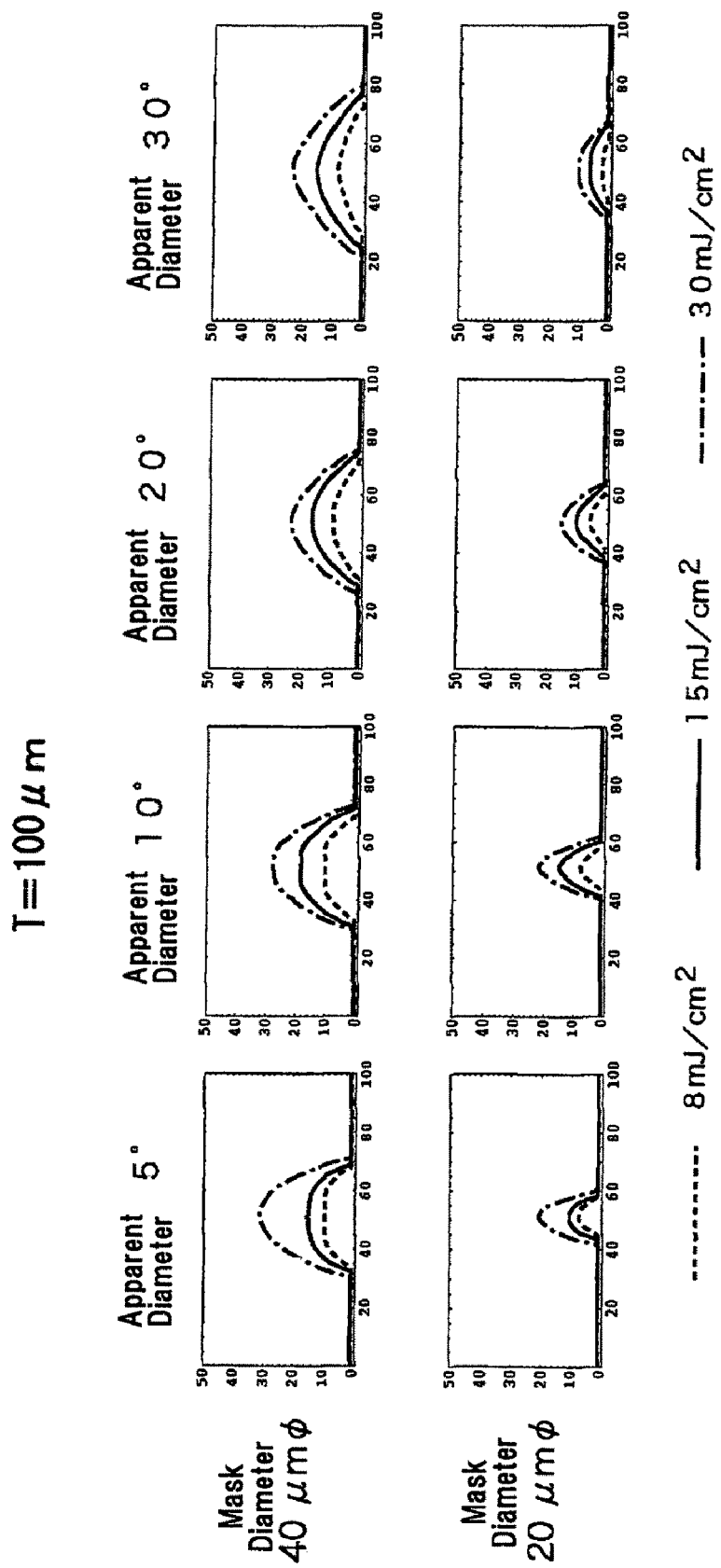
FIG. 11 is another series of graphs showing change of convex shape depending on light exposure with 2 different fixed mask aperture diameters and different apparent diameters.
Figure 12:
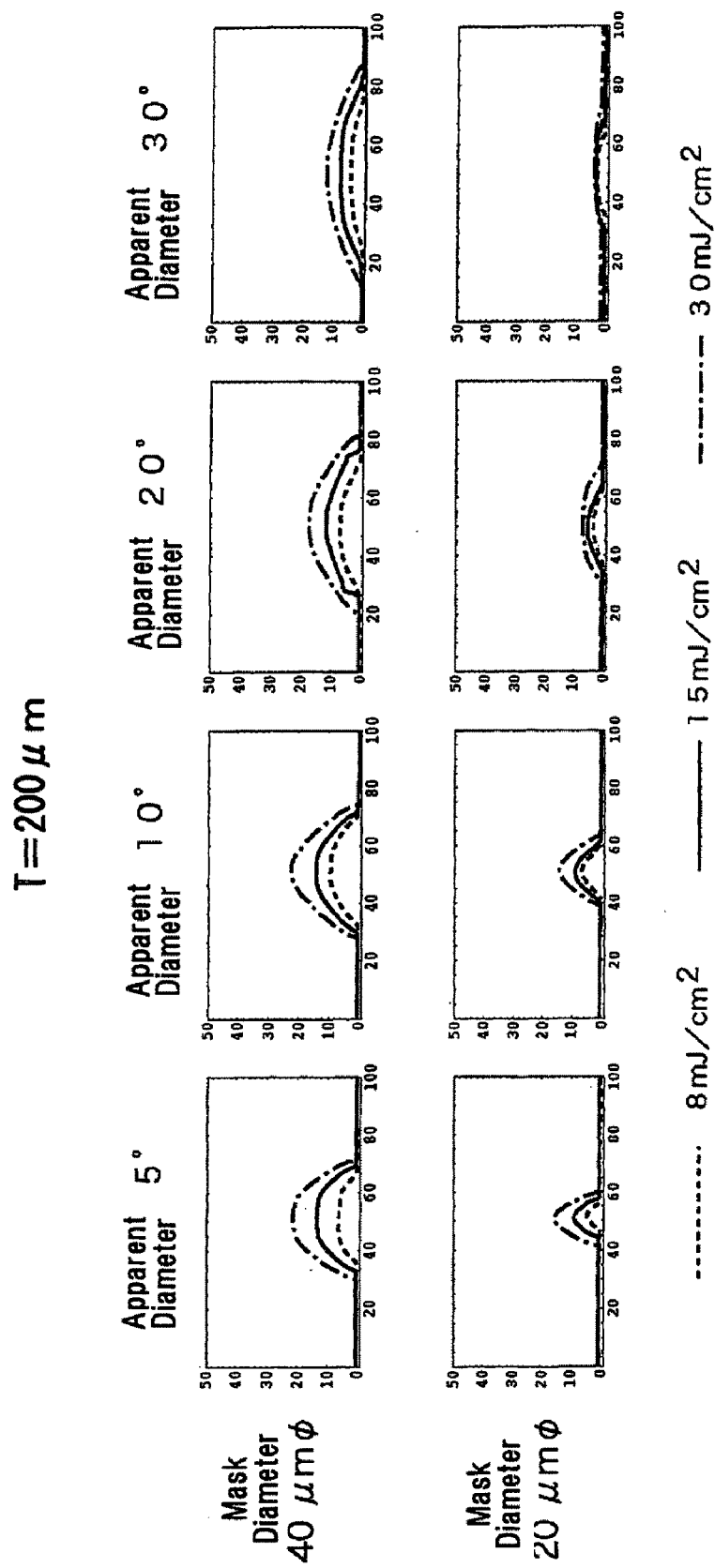
FIG. 12 is yet another series of graphs showing change of convex shape depending on light exposure with two different fixed mask aperture diameters and different apparent diameters.
Figure 13:
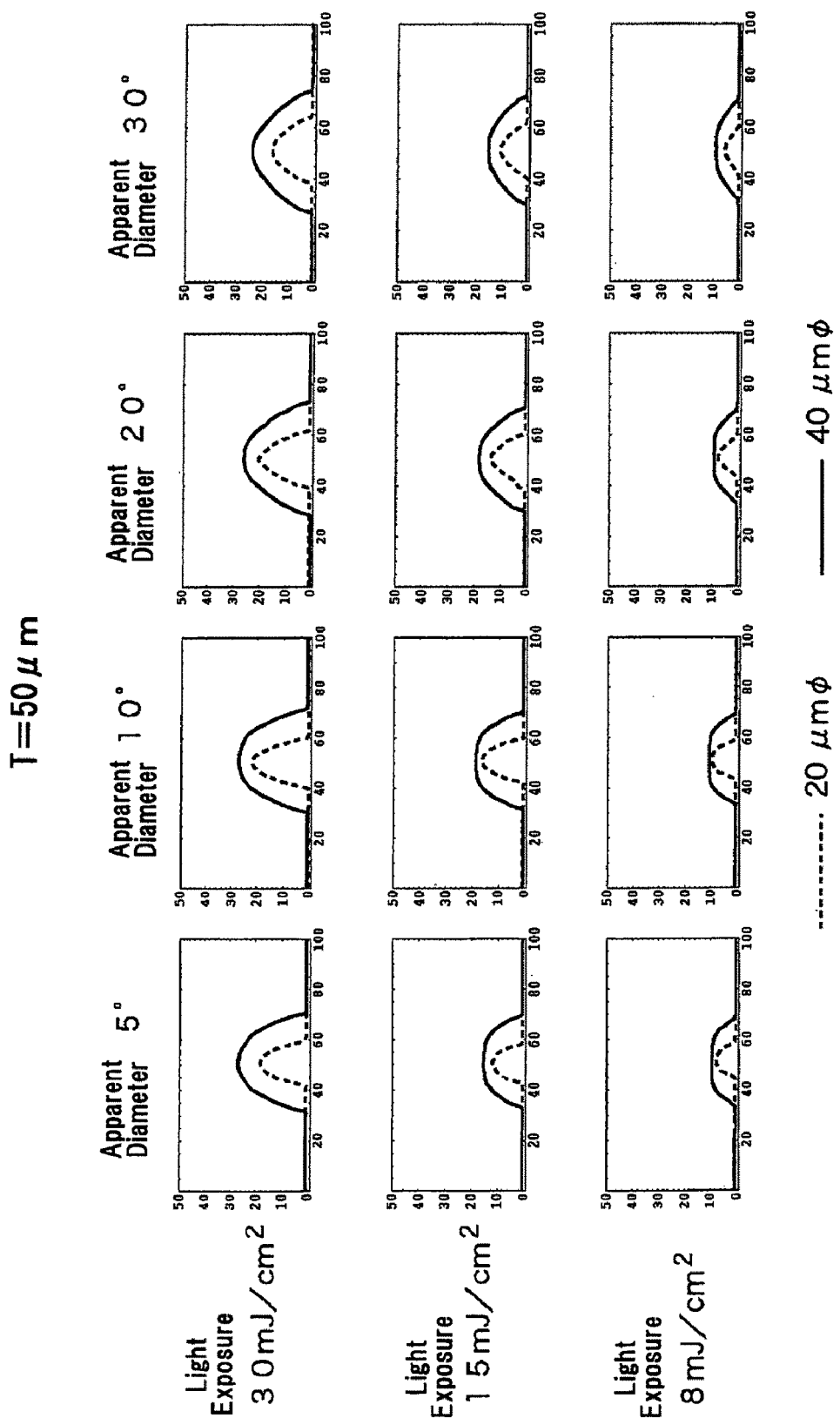
FIG. 13 is a series of graphs showing change of convex shape depending on apparent diameter with three different fixed light exposures.
Figure 14:
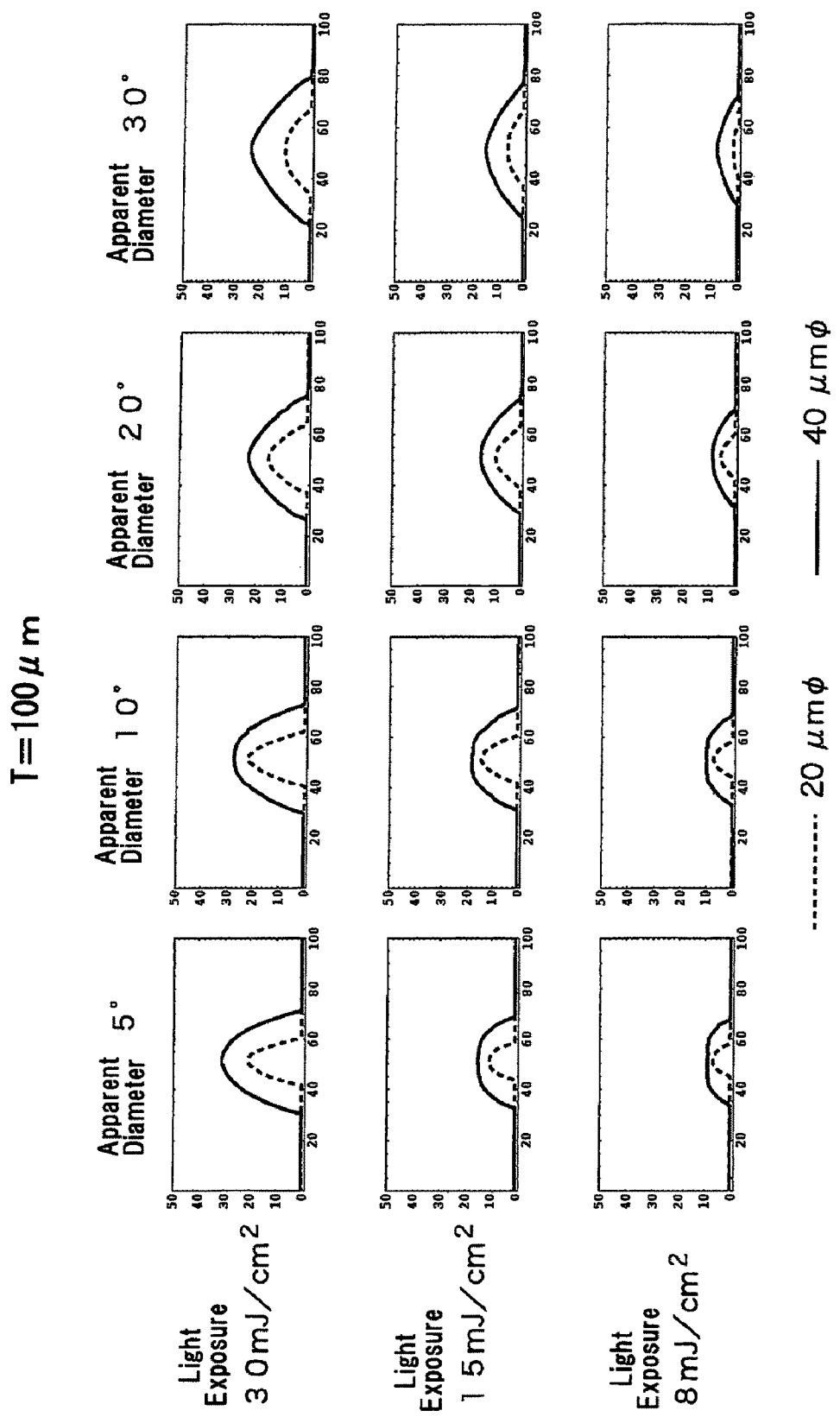
FIG. 14 is another series of graphs showing change of convex shape depending on apparent diameter with three different fixed light exposures.
Figure 15:
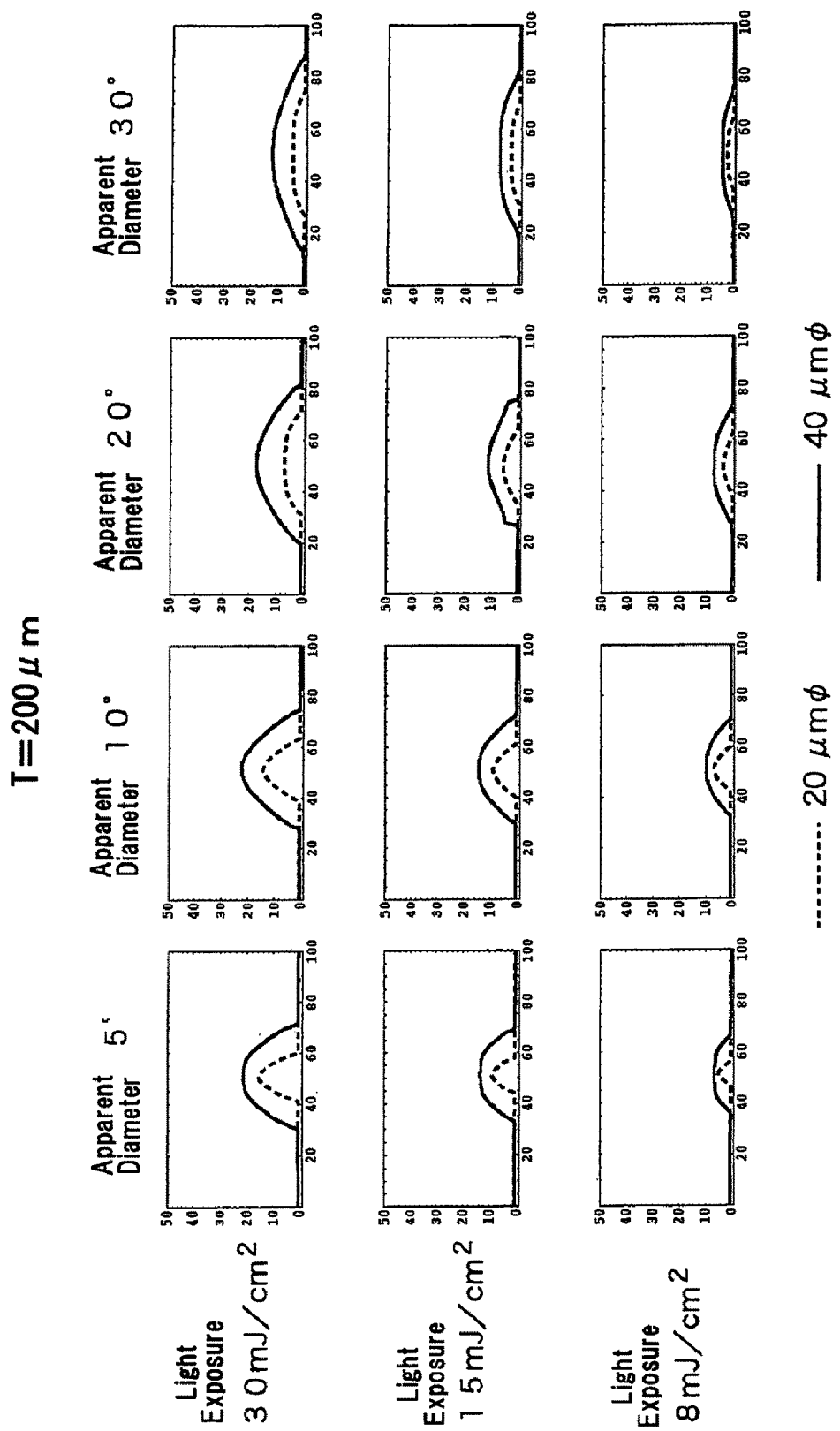
FIG. 15 is yet another series of graphs showing change of convex shape depending on apparent diameter with three different fixed light exposures.

FIGS. 10 to 12 include graphs showing difference of the shapes induced by changing light exposure with fixed mask aperture diameter and apparent diameter for the distances between the mask and the resist (T) of 50 μm, 100 μm and 200 μm. FIGS. 13 to 15 include graphs showing difference of shapes induced by changing the mask aperture diameter with fixed light exposure and apparent diameter for the distances between the mask and the resist (T) of 50 μm, 100 μm and 200 μm.

For example, the upper left graph in FIG. 10 shows shapes of convex observed with changing the light exposure to be 8 mJ/cm$^2$, 15 mJ/cm$^2$ and 30 mJ/cm$^2$ with a distance between the mask and the resist (T) of 50 μm, mask aperture diameter of 40 μm and apparent diameter of 5°. Further, the upper left graph in FIG. 13 shows shapes of convex observed with changing the mask aperture diameter to be 20 μm and 40 μm with a distance between the mask and the resist (T) of 50 μm, light exposure of 30 mJ/cm$^2$ and apparent diameter of 5°.

As seen from the results shown in FIGS. 10 to 15, as the light exposure increased, the height of convex became larger, and the volume of convex also increased substantially linearly. Further, as the aperture diameter of the mask became larger, the size of the bottom of convex became larger, but the inclination hardly changed. On the other hand, as seen from comparison of the results for different apparent diameters in the graphs, even with the same mask aperture diameter, the shape of convex, especially the inclination, changed, when the apparent diameter changed. For example, if the shape shown in the leftmost graph of FIG. 12 (apparent diameter: 5°) is compared with the shape in the rightmost graph (apparent diameter: 30°), it can be seen that the convex obtained with the apparent diameter of 30° had extremely smooth inclination (small height). Although this tendency is remarkable in the case of the distance between the mask and the resist (T) of 200 μm (FIGS. 12 and 15), it was also seen when the distance (T) was 50 μm or 100 μm.

Figure 16:
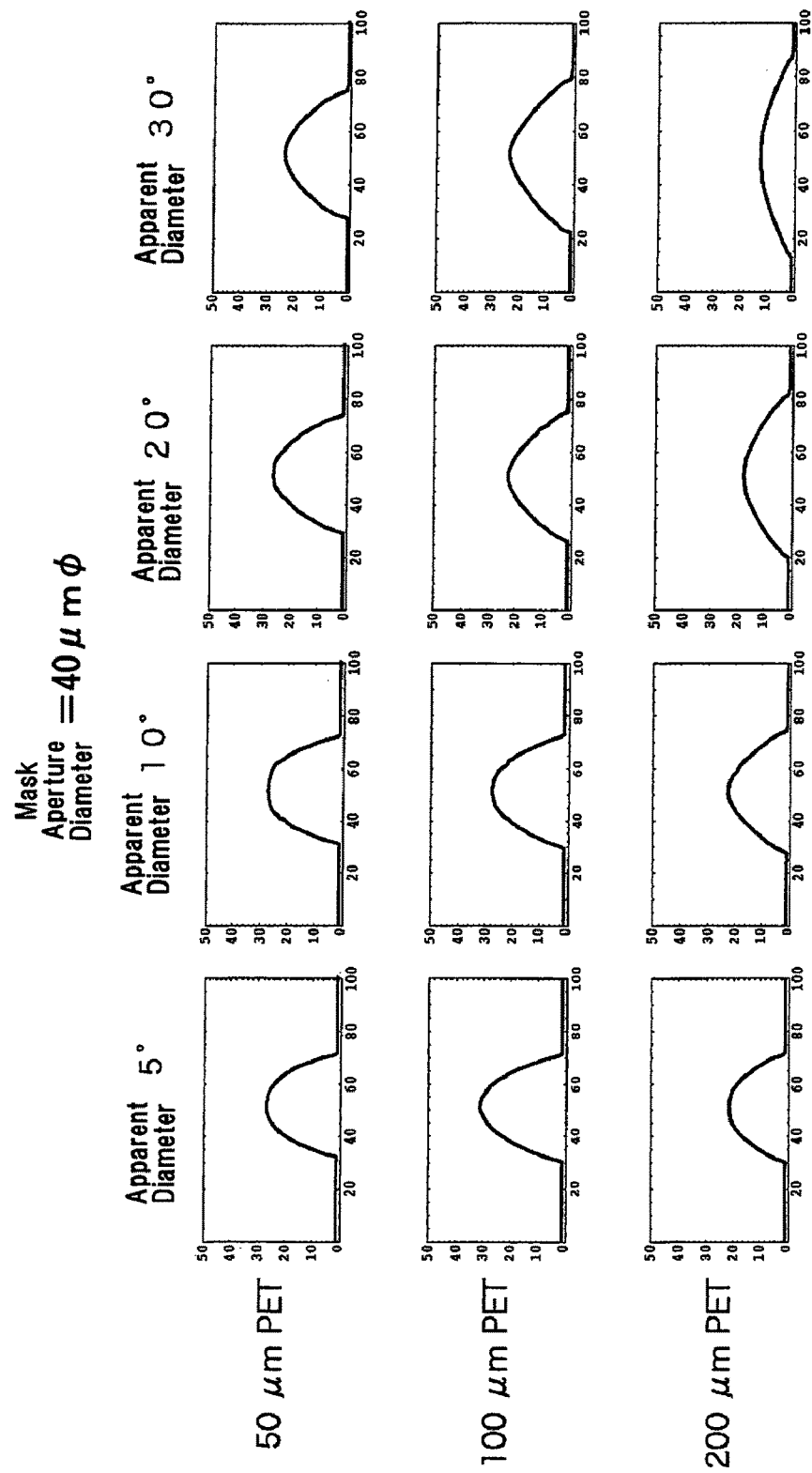
FIG. 16 is a series of graphs showing change of convex shape depending on distance between mask and resist T and apparent diameter.
Figure 17:
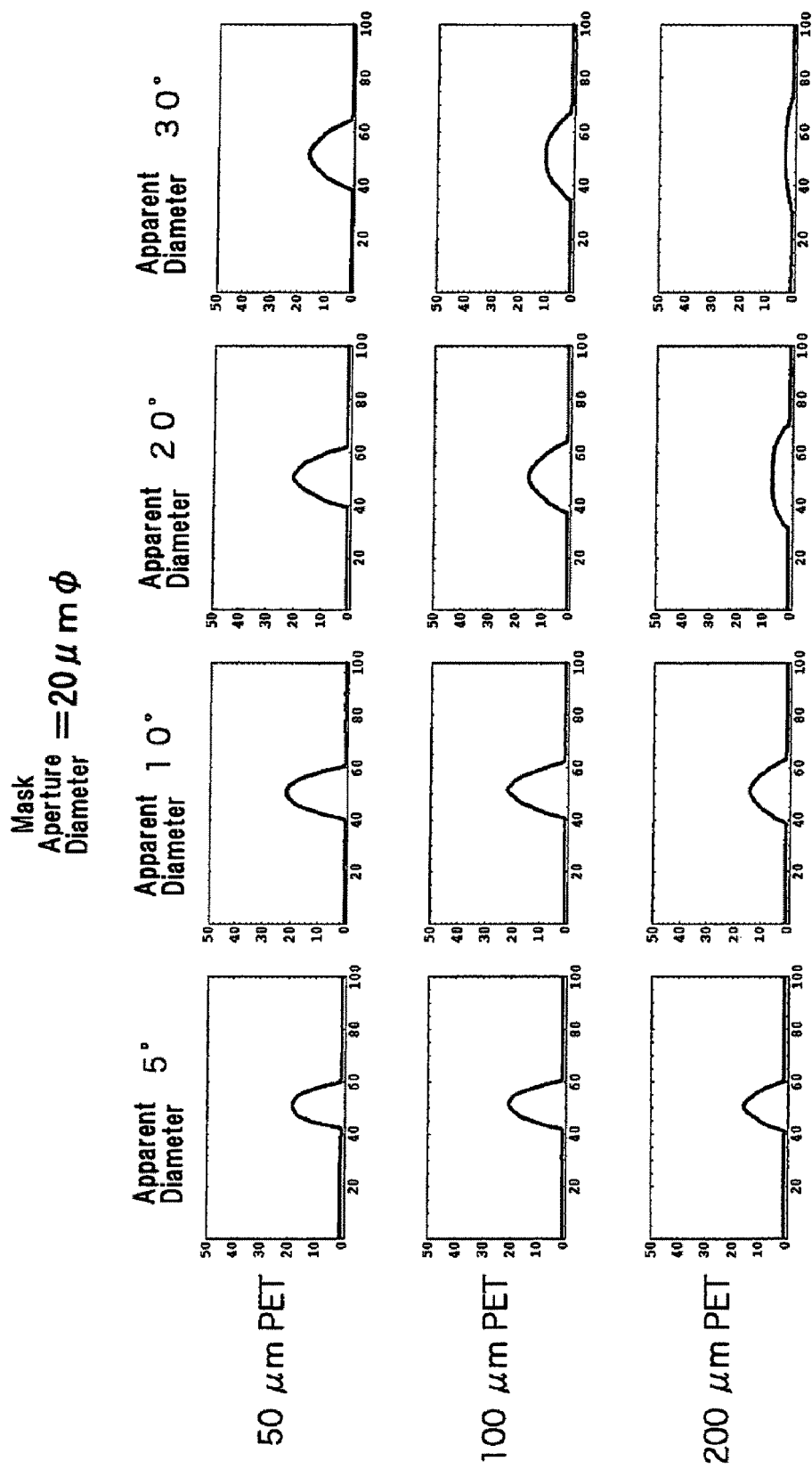
FIG. 17 is another series of graphs showing change of convex shape depending on distance between mask and resist T and apparent diameter.

Further, FIGS. 16 and 17 show difference of shape observed by changing the distance T between the mask and the resist with fixed apparent diameter and mask aperture diameter (FIG. 16 shows the results obtained with the mask aperture diameter of 40 μm Φ and FIG. 17 shows the results obtained with the mask aperture diameter of 20 μm Φ). From the results shown in these graphs, it can be seen that it becomes possible to change the shape of convex even with the same apparent diameter by changing the distance T between the mask and the resist. That is, it was demonstrated that even if the same light exposure (30 mJ/cm$^2$ in this case) and the mask of the same aperture diameter (for example, 40 μm) were used, the convex can be changed from a convex having steep inclination to a flat convex by changing the distance T between the mask and the resist.

Example 2

On a polyester film having a thickness of 100 μm (trade name: Lumirror T60, Toray Industries, Inc., refractive index: 1.64), a resist layer was formed in the same manner as that of Example 1. On the surface of the polyester film opposite to the side of the photosensitive film, a Cr mask having multiple circular apertures having different diameters (diameter: 20 μm or 40 μm) was disposed, and light exposure was performed from the Cr mask side in the same manner as that of Example 1 at a light exposure of 30 mJ/cm$^2$ and apparent diameter of 5°. After completion of the light exposure, the polyester film was delaminated, and the surface of the photosensitive film exposed by the delamination was adhered to an aluminum plate with adhesive. Then, the resist was developed, washed with water and dried in the same manner as that of Example 1 to obtain a sample of aluminum plate on which surface convexes and concaves were formed.

The surface profile of the sample obtained in this example was substantially the same as that obtained under the same conditions in Example 1.

On the basis of this result, it was demonstrated that convexes and concaves could be formed on another substrate by adhering a surface of the photosensitive film which had faced the mask to the other substrate after the light exposure and performing the development. Therefore, it is possible to form convexes and concaves even on a substrate which does not transmit light by using this method.

Example 3

On the surface having convexes and concaves of the sample produced in Example 1 (sample produced under the conditions of apparent diameter: 10°, mask aperture diameter: 40 μm, T/n: 30.5 cm (thickness of polyester film: 50 μm), and light exposure: 30 mJ/cm$^2$), a two-pack type curable silicone resin (KE-108, curing agent: CAT-108, Shin-Etsu Chemical Co., Ltd.) was poured and cured, and then the surface having convexes and concaves was delaminated to obtain silicone resin on which surface convexes and concaves were formed.

The surface convexes and concaves of the silicone resin obtained in this example had shapes of convexes and concaves complementary to the original surface convexes and concaves.

Example 4

On the surface of the sample produced in Example 1 (sample produced under the conditions of apparent diameter: 10°, mask aperture diameter: 40 μm, T/n: 30.5 cm (thickness of polyester film: 50 μm), and light exposure: 30 mJ/cm$^2$), a nickel thin film 61 was formed by sputtering as shown in FIG. 9 to make the surface conductive. On this surface, a nickel layer 60 was formed by a usual nickel electrocasting method. The surface of this nickel layer had convex and concave shapes complementary to those of the original surface convexes and concaves. Furthermore, by filling this nickel layer 60 as a mold with the photo-curable resin 71, covering it with a transparent polyester film 72, and irradiating light through the polyester film to cure the resin, convex and concave shape having the same convexes and concaves as those of the original surface convexes and concaves could be formed on the polyester film.

The invention claimed is:

1. A method for producing fine convex and concave shapes on a surface of a material, which comprises:

disposing a mask member having light transmitting sections and non-light transmitting sections over and spaced by a first distance from one side of a photosensitive film consisting of a photosensitive resin composition;

exposing the photosensitive film to light from a light source disposed on the side of the mask member, through the light transmitting sections of the mask member; and removing exposed portions or unexposed portions of the photosensitive film by development to produce the convex and concave shapes on the photosensitive film, the shapes being determined by shapes of the exposed portions or unexposed portions;

wherein, in exposing the photosensitive film to light, light exposure conditions are controlled so as to control the shapes of the exposed portions or unexposed portions;

wherein the controlled light exposure conditions include a second distance, between the light source and a light shielding surface of the mask member, and size of the light source; and wherein the light exposure conditions are controlled so that, when distance between a point at which a normal of the light source passing the center of the light source crosses the light shielding surface of the mask member and the center of the light source is the second distance and is represented by L, and size of the light source is represented by D (length unit), and an angle θ, defined as $\theta = 2\tan^{-1}(D/2L)$, is not smaller than 10° and not larger than 30°.

2. The method according to claim 1, wherein:
the light source has a circular shape.

3. The method according to claim 1, further comprising:
controlling the first distance between the mask member and the photosensitive film.

4. The method according to claim 1, wherein:
the photosensitive film consists of a negative type photosensitive resin composition which is cured by light exposure.

5. The method according to claim 1, wherein:
the first distance, between the light shielding surface of the mask member and the photosensitive film, is controlled so that a value obtained by dividing the first distance by refractive index of medium existing between them is 2 mm or smaller.

6. The method according to claim 1, wherein:
the photosensitive film is formed on or disposed in contact with a substantially transparent substrate, and the exposing of the photosensitive to light is performed from the side of the substrate.

7. The method according to claim 1, wherein:
the photosensitive film is adhered to a first substrate during the step of exposing the photosensitive film to light;
after the step of exposing the photosensitive film to light, the photosensitive film is removed from the first substrate and the surface of the photosensitive film which has faced the mask member is adhered to a different, second substrate, and then the removing of the exposed or unexposed portions step is performed to produce a surface having convex and concave shapes on the photosensitive film adhered to the second substrate.

8. A method for producing a member having surface convex and concave shapes by using a mold having complementary fine surface convex and concave shapes, wherein:
the mold is a mold produced by the method for producing surface convex and concave shapes according to claim 1.

9. A method for producing a member having surface convex and concave shapes by using a mold having complementary fine surface convex and concave shapes, wherein:
the mold is a second mold produced by using a first mold produced by the method according to claim 1, and wherein surface convex and concave shapes are the same as the shapes of the first mold are formed on the member.

10. The method according to claim 1, wherein:
the material on which surface convex and concave shapes are formed is an optical material in the form of a light diffusing plate, light control film or microlens.

11. The method according to claim 1, wherein:
the photosensitive film is supported on a first surface of a substrate and the mask is disposed on a second surface of the substrate, opposite the first surface.

12. The method according to claim 11, wherein:
the mask is disposed directly in contact with the second surface whereby the first distance is equal to the thickness of the substrate.

13. The method according to claim 11, wherein:
the mask is disposed on the second surface through a transparent film therebetween, whereby the first distance is equal to the sum of the thickness of the substrate and the thickness of the transparent film.

* * * * *